(12) United States Patent
Hartman

(10) Patent No.: US 10,681,812 B2
(45) Date of Patent: Jun. 9, 2020

(54) METHOD OF PROVIDING A FLEXIBLE CONNECTOR

(71) Applicant: Jeffrey David Hartman, Severn, MD (US)

(72) Inventor: Jeffrey David Hartman, Severn, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/439,415

(22) Filed: Jun. 12, 2019

(65) Prior Publication Data

US 2019/0313530 A1 Oct. 10, 2019

Related U.S. Application Data

(62) Division of application No. 15/377,670, filed on Dec. 13, 2016, now abandoned.

(51) Int. Cl.
*H05K 1/14* (2006.01)
*H05K 3/36* (2006.01)
(Continued)

(52) U.S. Cl.
CPC ........... *H05K 1/148* (2013.01); *H01R 12/716* (2013.01); *H05K 1/0278* (2013.01); *H05K 1/11* (2013.01); *H05K 3/10* (2013.01); *H05K 3/366* (2013.01); *H05K 3/4007* (2013.01); *H05K 3/4691* (2013.01); *H05K 2201/04* (2013.01);
(Continued)

(58) Field of Classification Search
USPC ......... 361/749–750, 767–777; 174/254–262; 439/449–459
See application file for complete search history.

(56) References Cited

U.S. PATENT DOCUMENTS

| 4,338,149 A | 7/1982 | Quaschner |
| 4,466,184 A * | 8/1984 | Cuneo .................... H01R 12/62 29/830 |

(Continued)

FOREIGN PATENT DOCUMENTS

| EP | 2728983 A1 | 5/2014 |
| WO | 2006132108 A1 | 12/2006 |

*Primary Examiner* — Tuan T Dinh
(74) *Attorney, Agent, or Firm* — Tarolli, Sundheim, Covell & Tummino LLP

(57) ABSTRACT

A flexible connector includes a unitary connector block having first and second board-facing areas. The first and second board-facing areas are longitudinally spaced from each other on a chosen surface of the connector block. The connector block includes a block body transversely separating the chosen surface from an opposing surface oppositely facing from the chosen surface. The connector block includes a flexible connector bridge longitudinally interposed between the first and second board-facing areas. A first connector port is located within the first board-facing area. A second connector port is located within the second board-facing area. A connector trace extends through at least a portion of the block body between the first and second board-facing areas. The connector trace electrically connects the first and second connector ports. Methods of making and using the flexible connector are also included.

5 Claims, 6 Drawing Sheets

(51) Int. Cl.
*H05K 1/11* (2006.01)
*H05K 3/40* (2006.01)
*H05K 3/10* (2006.01)
*H01R 12/71* (2011.01)
*H05K 1/02* (2006.01)
*H05K 3/46* (2006.01)

(52) U.S. Cl.
CPC ............... *H05K 2201/058* (2013.01); *H05K 2201/10189* (2013.01)

(56) References Cited

U.S. PATENT DOCUMENTS

| | | | |
|---|---|---|---|
| 4,687,695 A | 8/1987 | Hamby | |
| 4,715,928 A * | 12/1987 | Hamby | H05K 3/4691 156/150 |
| 5,160,269 A * | 11/1992 | Fox, Jr. | H01R 12/61 439/197 |
| 5,161,981 A * | 11/1992 | Deak | H01R 12/62 439/491 |
| 6,040,624 A | 3/2000 | Chambers et al. | |
| 7,251,712 B2 * | 7/2007 | Unno | G11C 29/76 711/154 |
| 7,407,408 B1 * | 8/2008 | Taylor | H05K 1/118 439/449 |
| 8,118,611 B2 | 2/2012 | Jeon | |
| 8,359,738 B2 | 1/2013 | Takahashi et al. | |
| 9,485,860 B2 | 11/2016 | Yosui | |
| 2004/0049914 A1 | 3/2004 | Wang et al. | |
| 2010/0112833 A1 | 5/2010 | Jeon | |
| 2014/0175671 A1 | 6/2014 | Haba et al. | |
| 2014/0353014 A1 * | 12/2014 | Lai | H05K 3/4691 174/254 |
| 2014/0364004 A1 | 12/2014 | Oniki | |

* cited by examiner

METHOD OF PROVIDING A FLEXIBLE CONNECTOR

RELATED APPLICATIONS

This application claims priority from U.S. patent application Ser. No. 15/377,670, filed 13 Dec. 2016, which is incorporated herein in its entirety.

GOVERNMENT SUPPORT

This invention was made with Government support under Contract No. 30059269. The Government has certain rights in this invention.

TECHNICAL FIELD

This disclosure relates to an apparatus and method for use of a flexible connector and, more particularly, to an apparatus and method for electrically connecting pairs of pads on mutually angularly arranged circuit boards.

BACKGROUND

Sophisticated integrated systems may use a combination of electronic component configurations to achieve desired packaging size/shape goals. For example, two circuit boards could be linked at an angle to one another (other than 180°) to fit in a desired use environment. These mutually-angled circuit boards need to be electrically connected together. Currently, commercial angle connectors are only capable of 90° connections between circuit boards, for several hundred I/O connections on a 0.5-0.75 mm pitch spacing.

SUMMARY

In an embodiment, a flexible connector is described. A unitary connector block has first and second board-facing areas. The first and second board-facing areas are longitudinally spaced from each other on a chosen surface of the connector block. The connector block includes a block body transversely separating the chosen surface from an opposing surface oppositely facing from the chosen surface. The connector block includes a flexible connector bridge longitudinally interposed between the first and second board-facing areas. A first connector port is located within the first board-facing area. A second connector port is located within the second board-facing area. A connector trace extends through at least a portion of the block body between the first and second board-facing areas. The connector trace electrically connects the first and second connector ports.

In an embodiment, a method is provided. A planar chosen substrate has transversely spaced top and bottom chosen substrate surfaces. First and second board-facing areas longitudinally spaced from each other are defined on a selected one of the top and bottom chosen substrate surfaces. A planar opposing substrate has transversely spaced top and bottom opposing substrate surfaces. The chosen and opposing substrates are attached together to at least partially form a unitary connector block including a block body with the first and second board-facing areas on an outward-facing surface thereof. A conductive material is deposited to generate a first connector port located within the first board-facing area. A conductive material is deposited to generate a second connector port located within the second board-facing area. A conductive material is deposited on at least one of the chosen and opposing substrate surfaces to generate a connector trace extending through at least a portion of the block body between the first and second board-facing areas. The first and second connector ports are electrically connected with the connector trace. A thickness of one of the chosen and opposing substrate surfaces is selectively reduced to define a flexible connector bridge longitudinally interposed between the first and second board-facing areas. Relative angular motion of the first and second board-facing areas is facilitated with the connector bridge.

In an embodiment, an apparatus is provided for electrically connecting pairs of pads on mutually angularly arranged circuit boards. A planar chosen substrate has transversely spaced top and bottom chosen substrate surfaces. First and second board-facing areas are longitudinally spaced from each other on a selected one of the top and bottom chosen substrate surfaces. A planar opposing substrate has transversely spaced top and bottom opposing substrate surfaces. A selected one of the chosen and opposing substrates has a significantly varied transverse thickness along a longitudinal dimension thereof. A unitary connector block is at least partially formed by the chosen and opposing substrates. The connector block includes a block body. A first connector port is located within the first board-facing area. A second connector port is located within the second board-facing area. A connector trace extends through at least a portion of the block body between the first and second board-facing areas. The connector trace electrically connects the first and second connector ports. A flexible connector bridge is longitudinally interposed between the first and second board-facing areas for facilitating relative angular motion of the first and second board-facing areas.

BRIEF DESCRIPTION OF THE DRAWINGS

For a better understanding, reference may be made to the accompanying drawings, in which.

DESCRIPTION OF ASPECTS OF THE DISCLOSURE

Figure 1:
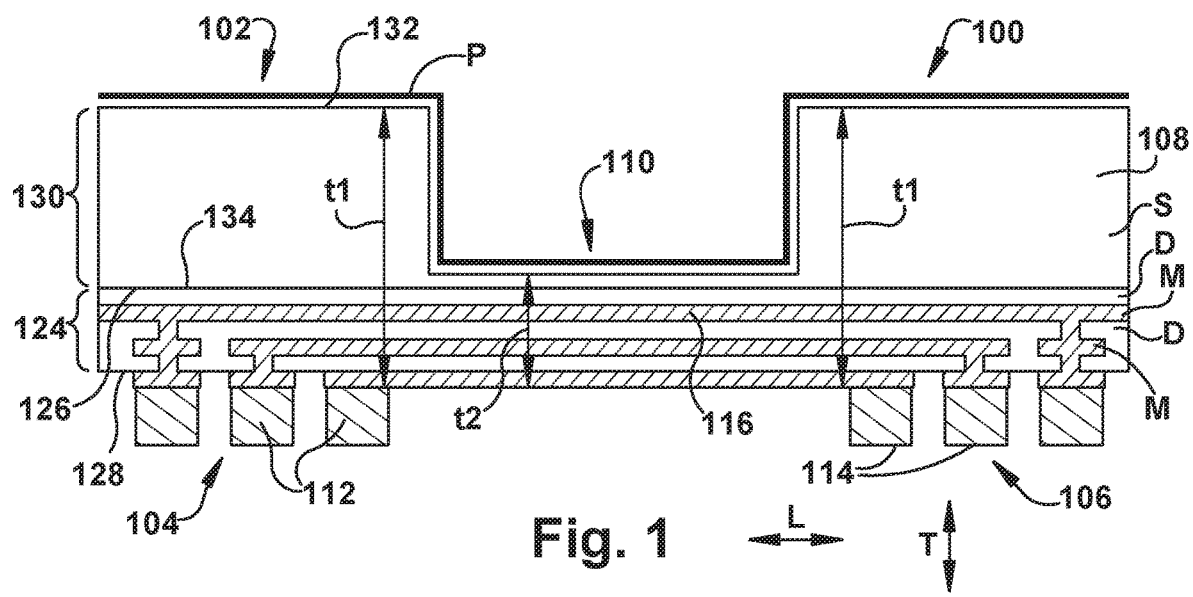
FIG. 1 is a schematic front view of one aspect of the invention.

As used herein, the singular forms "a," "an" and "the" can include the plural forms as well, unless the context clearly indicates otherwise. It will be further understood that the terms "comprises" and/or "comprising," as used herein, can specify the presence of stated features, steps, operations, elements, and/or components, but do not preclude the presence or addition of one or more other features, steps, operations, elements, components, and/or groups thereof.

As used herein, the term "and/or" can include any and all combinations of one or more of the associated listed items.

As used herein, phrases such as "between X and Y" and "between about X and Y" can be interpreted to include X and Y.

As used herein, phrases such as "between about X and Y" can mean "between about X and about Y."

As used herein, phrases such as "from about X to Y" can mean "from about X to about Y."

It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "directly adjacent" another feature may have portions that overlap or underlie the adjacent feature, whereas a structure or feature that is disposed "adjacent" another feature might not have portions that overlap or underlie the adjacent feature.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms can encompass different orientations of a device in use or operation, in addition to the orientation depicted in the figures. For example, if a device in the figures is inverted, elements described as "under" or "beneath" other elements or features would then be oriented "over" the other elements or features.

It will be understood that, although the terms "first," "second," etc. may be used herein to describe various elements, these elements should not be limited by these terms. These terms are only used to distinguish one element from another. Thus, a "first" element discussed below could also be termed a "second" element without departing from the teachings of the present disclosure. The sequence of operations (or steps) is not limited to the order presented in the claims or figures unless specifically indicated otherwise.

This technology comprises, consists of, or consists essentially of the following features, in any combination.

FIG. 1 depicts an apparatus, shown here as a flexible connector 100, which could be a flexible circuit board connector, which can be used to electrically connect pairs of pads on mutually angularly arranged electronic components, as will be described in greater detail with circuit boards as an example in FIG. 2. It will be understood that the connector technology described herein using a circuit board use environment is applicable to any other connector use environments, such as connecting other electronic components The flexible connector 100 can allow for stripline, coplanar waveguide, and/or microstrip routing, and has a high density of interconnects, which may be sufficient to provide hundreds to thousands of I/O connections on a 100-200 micrometer pitch.

As shown in FIG. 1, a unitary connector block 102 has first and second board-facing areas, shown generally at 104 and 106, respectively. (The term "board-facing" is used here, for clarity of description, in the context of the circuit board example use environment, but it is contemplated that a "board" need not be present for another use environment of the flexible connector 100.) The first and second board-facing areas 104 and 106 are longitudinally spaced from each other on a chosen surface (the lower side, in the orientation and configuration of FIG. 1) of the connector block 102. The "longitudinal" direction, as referenced herein, is substantially horizontal in the orientation of FIG. 1, and is represented by arrow "L". The connector block 102 includes a block body 108 transversely separating the chosen surface from an opposing surface (the upper side, in the orientation and configuration of FIG. 1) oppositely facing from the chosen surface. The "transverse" direction, as referenced herein, is perpendicular to the longitudinal direction—thus, substantially vertical in the orientation of FIG. 1—and is represented by arrow "T".

The connector block 102 includes a flexible connector bridge 110 longitudinally interposed between the first and second board-facing areas 104 and 106. The connector bridge 110 and the first and second board-facing areas 104 and 106 may all be made from the same material. For example, the connector block 102 could at least partially be made of a silicon wafer that has been processed, as will be described below or in any other suitable manner, to generate the connector bridge 110 as a reduced-thickness (including zero-thickness) portion, and the first and second board-facing areas 104 and 106 as a full-thickness portion, of the same original block of raw material. Stated differently, the connector bridge 110 and the first and second board-facing areas 104 and 106 may be concurrently and unitarily formed as a monolithic component of the connector block 102 (i.e., not intended for disassembly post-manufacture). The connector block 102 may have a first transverse thickness (t1) at the first and/or second board-facing areas 104 and 106, and a second transverse thickness (t2) at the connector bridge 110. The second transverse thickness t2 may be a minority (less than half as much), which may be a super-minority (less than one third as much), of the first transverse thickness t1. For example, the first transverse thickness t1 could be in the range of 600-700 microns, such as in the range of 640-660 microns, while the second transverse thickness t2 could be in the range of 5-25 microns, such as in the range of 10-20 microns. (For example, silicon is sufficiently flexible across a thickness of 5-25 microns to permit bending through a range of angles as disclosed herein.) However, it is also contemplated that the first and second transverse thicknesses t1 and t2 could be substantially similar, for a particular use environment.

A selected one of the chosen surface and the opposing surface of the connector block 102 may be contoured at differing distances from the other one of the chosen surface and the opposing surface along a longitudinal dimension of the connector block 102, as shown. For example, as shown in the arrangement of FIG. 1, the opposing (top) surface of the connector block 102, when ready for use, may have a "stepped" profile (shown generally at P) which varies the distance of the opposing surface from the chosen (bottom) surface in a linear fashion. It is contemplated, though, that the profile of the selected one of the chosen surface and the opposing surface of the connector block 102 may vary in a curved, curvilinear, linear, or any desired fashion (e.g., at least partially sloped or curved), and that the profile could also or instead vary in any desired fashion (e.g., gradually or in a stepwise fashion) in a lateral (i.e., into and out of the plane of the page of FIG. 1) direction, to provide a flexible connector 100 having desired properties for a particular use environment. For example, there could be a "spike" or other protrusion in the longitudinal direction along profile P for any desired reason, including, but not limited to, use as a reinforcement or handling aid.

The flexible connector 100 includes a first connector port 112 located within the first board-facing area 104. A second connector port 114 is located within the second board-facing area 106. A connector trace 116 (two labeled, in FIG. 1) extends through at least a portion of the block body 108 between the first and second board-facing areas 104 and 106. The connector trace 116 electrically connects the first and second connector ports 112 and 114.

Figure 2:
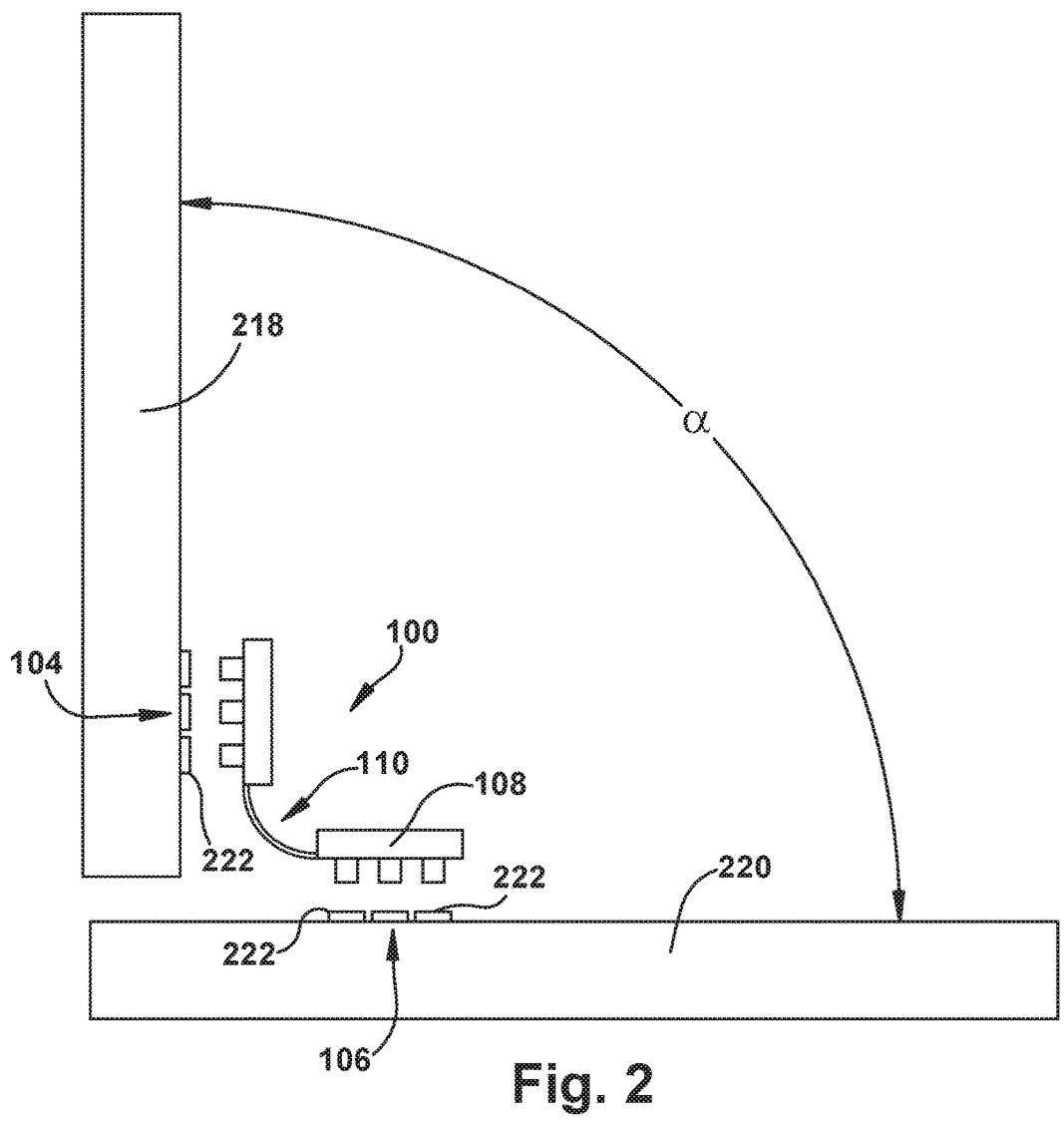
FIG. 2 is a schematic front view of the aspect of FIG. 1 in an example use environment.

As shown in FIG. 2, the chosen surface (in this Figure, the bottom surface, using the orientation of FIG. 1) of the flexible connector 100 faces first and second circuit boards 218 and 220, respectively for creating an electrical connection therebetween. The block body 108 is interposed between the chosen surface and the opposing surface. The flexible connector bridge 110, which is formed by a portion of the block body 108, is longitudinally interposed between the first and second board-facing areas 104 and 106 for facilitating relative angular motion of the first and second board-facing areas 104 and 106. In this manner, the flexible connector 100 can bend and flex to electrically connect pairs of pads 222 on mutually angularly arranged first and second circuit boards 218 and 220. The first and second circuit boards 218 and 220 are arranged relative to each other at an operative angle α. The operative angle α may be any desired angle which can be physically achieved by a predetermined configuration of the flexible connector 100. For example, and as shown in FIG. 2, the operative angle α is approximately 90°, or an orthogonal, "right" angle. One of ordinary skill in the art will be able to provide a flexible connector 100 having suitable dimensions (relative and absolute) and flexibility for spanning a desired operative angle α between first and second circuit boards 218 and 220.

Turning back to FIG. 1, the block body 108 may include a plurality of laminated substrate layers. For example, and as shown in FIG. 1, the block body 108 could include a portion (S) made of silicon, laminated with one or more layers of dielectric material (D), such as polymer, and/or metal (M). When multiple layers of metal are provided, each layer of metal could include a different level of conductive traces, as desired.

Any flexible connector 100, according to any aspect of the present invention, can be configured as including, as shown in FIG. 1, a planar chosen substrate (124, as shown in FIG. 1) having transversely spaced top and bottom chosen substrate surfaces 126 and 128, respectively, and first and second board-facing areas 104 and 106 being longitudinally spaced from each other on a selected one (here, bottom chosen substrate surface 128) of the top and bottom chosen substrate surfaces 126 and 128. A planar opposing substrate (130, as shown in FIG. 1) has transversely spaced top and bottom opposing substrate surfaces 132 and 134, respectively. A selected one (here, opposing substrate 130) of the chosen and opposing substrates 124 and 130 has a significantly varied transverse thickness along a longitudinal dimension thereof. A unitary connector block 102 is at least partially formed by the chosen and opposing substrates. The connector block 102 includes a block body 108. A first connector port 112 is located within the first board-facing area 104. A second connector port 114 is located within the second board-facing area 106. A connector trace 116 may extend through at least a portion of the block body 108 between the first and second board-facing areas 104 and 106. The connector trace 116 electrically connects the first and second connector ports 112 and 114. A flexible connector bridge 110 may be longitudinally interposed between the first and second board-facing areas 104 and 106 for facilitating relative angular motion of the first and second board-facing areas 104 and 106. This general description applies to any embodiment of the aspects of the invention shown and described herein. However, it should be noted that the substrate definitions and descriptions earlier in this paragraph apply to the configuration of the flexible connector 100 shown in FIGS. 1-2, where the connector bridge 110 is positioned on the connector block 102 toward the "interior" side of operative angle α.

Figure 3:
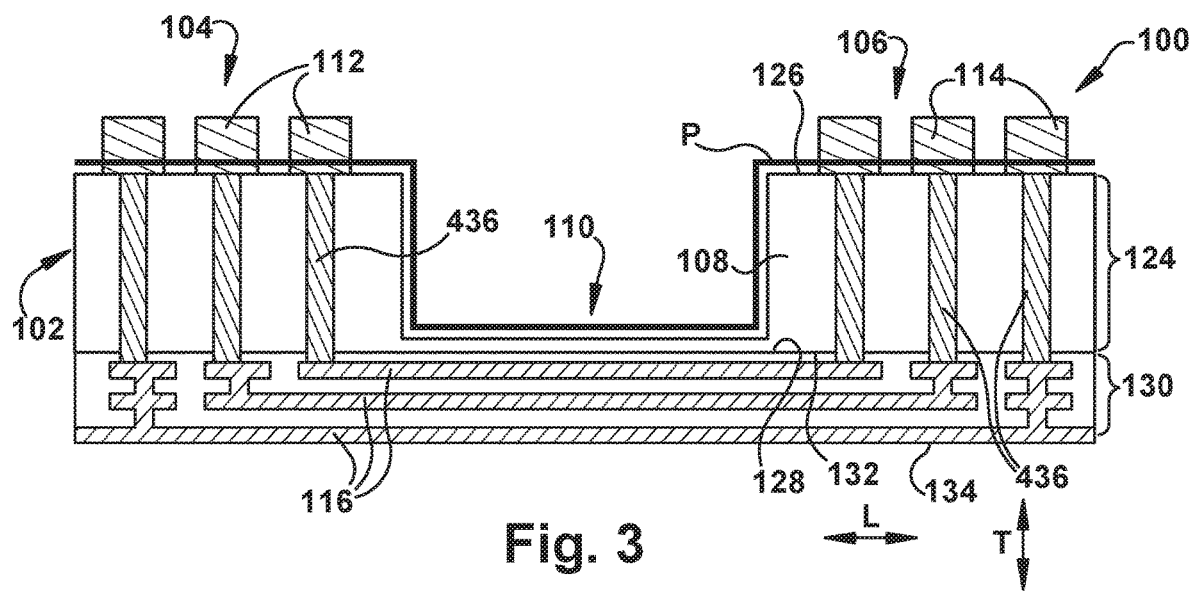
FIG. 3 is a schematic front view of an alternate configuration of the aspect of FIG. 1.
Figure 4:
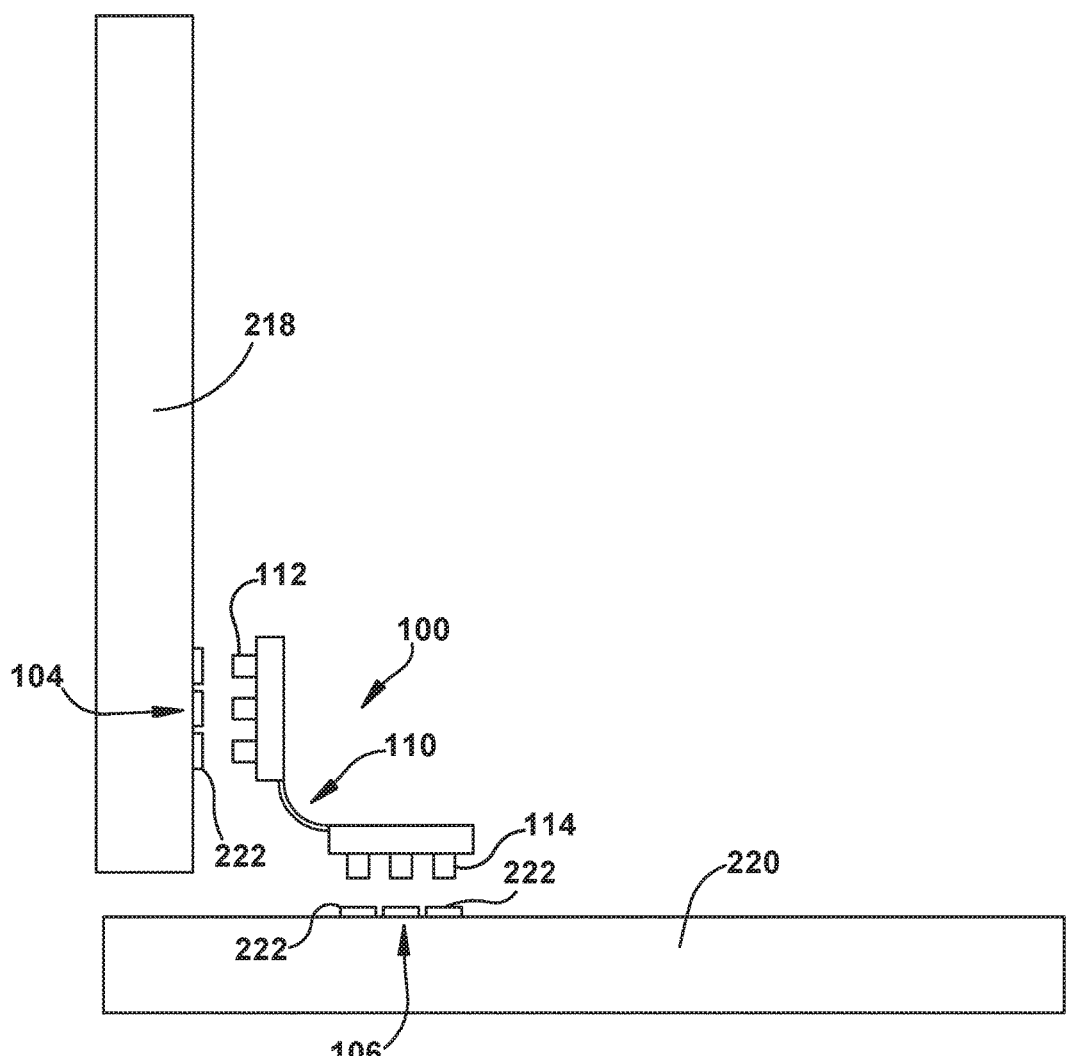
FIG. 4 is a schematic front view of the configuration of FIG. 3 in an example use environment.

In the configuration of the flexible connector 100 shown in FIGS. 3-4, in contrast to that of FIGS. 1-2, the connector bridge 110 is positioned on the connector block 102 toward the "exterior" side of operative angle α. Therefore, the identification of the "chosen" substrate 124 and "opposing" substrate 130, and the "top" and "bottom" as shown, are reversed for the configuration shown in FIGS. 3-4, as compared to the configuration of FIGS. 1-2. One of ordinary skill in the art will understand the manner in which the orientation and definitions can be adjusted to accurately reference each of these two configurations.

In the configuration of FIGS. 3-4, the block body 108 includes at least one increased-thickness portion and at least one reduced-thickness portion, as with the previously described configuration of FIGS. 1-2. However, in the configuration of FIGS. 3-4, the selected substrate layer 124 or 130 forming the chosen surface has a significantly varied transverse thickness along a longitudinal dimension thereof. Accordingly, each connector trace 116 of this configuration includes at least one via 436 extending transversely through an increased-thickness portion of the block body. In this manner, the material of the chosen substrate 124 can have the previously described varying profile P while also including the first and second board-facing areas 104 and 106. One of ordinary skill in the art will understand how to design and manufacture the configuration of the flexible connector 100 shown in FIGS. 3-4. Therefore, the remainder of this description, and FIGS. 5A-9C, will use the configuration of FIGS. 1-2 as an example, without excluding or prejudicing a corresponding characterization of the described and shown features and actions which uses the configuration of FIGS. 3-4.

Figure 5A:
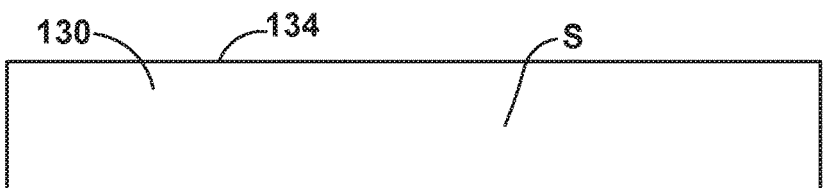
FIGS. 5A-5F schematically depict an example sequence of manufacture of the aspect of FIGS. 1 and 3.
Figure 5B:
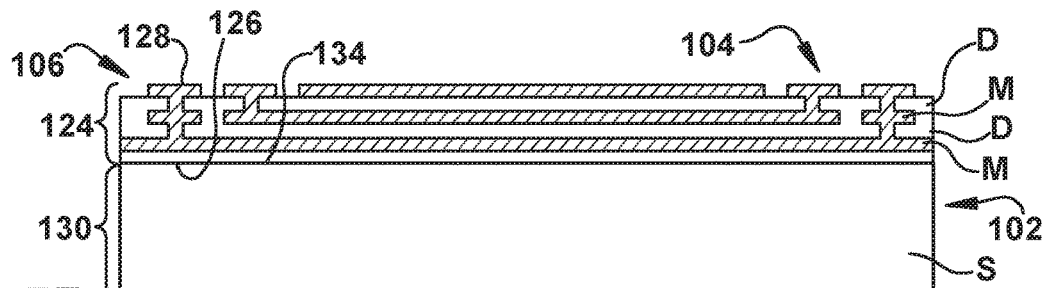

Turning to FIGS. 5A-5F, an example sequence of manufacture for the flexible connector 100 is shown. In FIG. 5A, a base block, characterized here as a silicon (or silicon on insulator) wafer or block "S" is provided. For the sake of description, this block "S" is being described as a planar opposing substrate 130 having transversely spaced top and bottom opposing substrate surfaces 132 and 134. (It should be noted that the "build" of FIGS. 5A-5F is depicted as being "upside down" from the corresponding finished flexible connector 100 shown in FIG. 1.) A planar chosen substrate 124 has transversely spaced top and bottom chosen substrate surfaces 126 and 128, which is depicted in FIG. 5B as including alternating layers of dielectric "D" and metal "M" laminated structures, which could be considered to be a "multi-level metallization layer" construct. First and second board-facing areas 104 and 106 longitudinally spaced from each other are defined on a selected one of the top and bottom chosen substrate surfaces—here, on the bottom chosen substrate surface 128. As shown also in FIG. 5B, the chosen and opposing substrates 124 and 130 are attached together to at least partially form a unitary connector block 102 including a block body 108 with the first and second board-facing areas 104 and 106 on an outward-facing surface thereof.

Figure 5C:
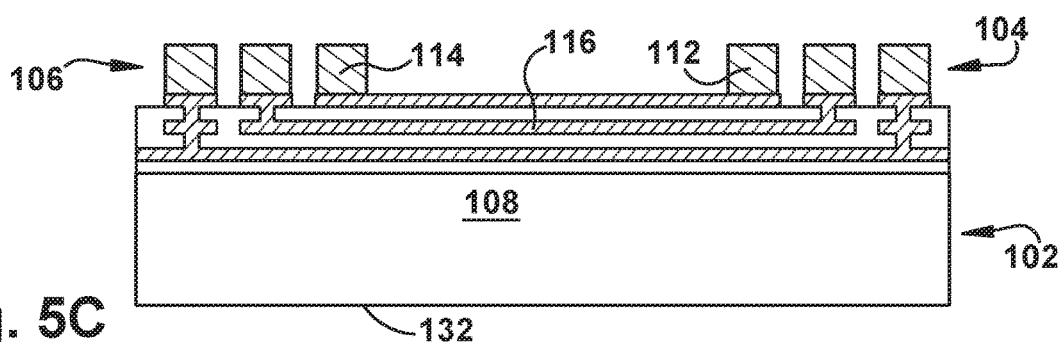

Turning to FIG. 5C, a conductive material is deposited to generate at least one first connector port 112 located within the first board-facing area 104. Similarly, a conductive material is deposited to generate at least one second connector port 114 located within the second board-facing area 106. The first and second connector ports 112 and 114 are shown and described herein as being "bump bonds". It is also contemplated that the first and second connector ports 112 and 114 could instead or also include press contact type interfaces, but it may be desirable to include some sort of holdaway structures in the flexible connector 100 for press contact interfaces.

A conductive material is deposited on at least one of the chosen and opposing substrate surfaces to generate a connector trace 116 extending through at least a portion of the block body 108 between the first and second board-facing areas 104 and 106. This could occur, for example, in any of FIGS. 5B-5F. The first and second connector ports 112 and 114 are electrically connected with the connector trace 116. (As an aside, it should be noted, for the configuration of the flexible connector 100 shown in FIGS. 3-4, depositing a conductive material on at least one of the chosen and opposing substrate surfaces to generate a connector trace 116 may include creating at least one via 436 extending transversely through an increased-thickness portion of the block body 108.)

Optionally, starting in FIG. 5C, a "handle wafer" (not shown) could be removably attached to the chosen substrate surface to facilitate handling of the flexible connector 100 during manufacture without unduly stressing fragile portions of the structure.

Figure 5D:
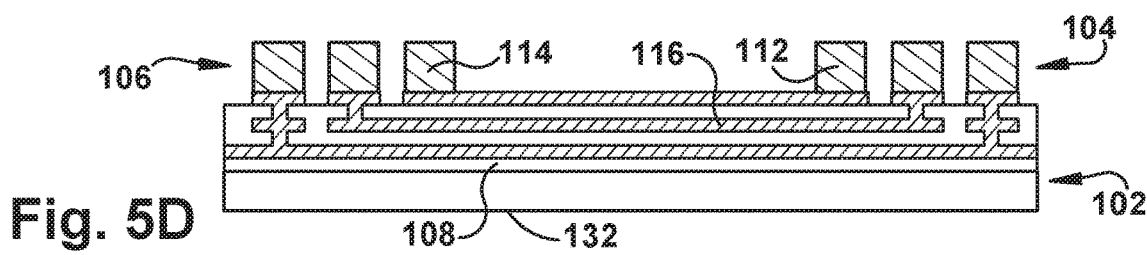

In FIG. 5D, a thickness of the opposing substrate 130 is optionally reduced across an entire longitudinal dimension thereof, in any desired manner, particularly if the initial silicon S block provided is thicker than desired for the final flexible connector 100.

Figure 5E:
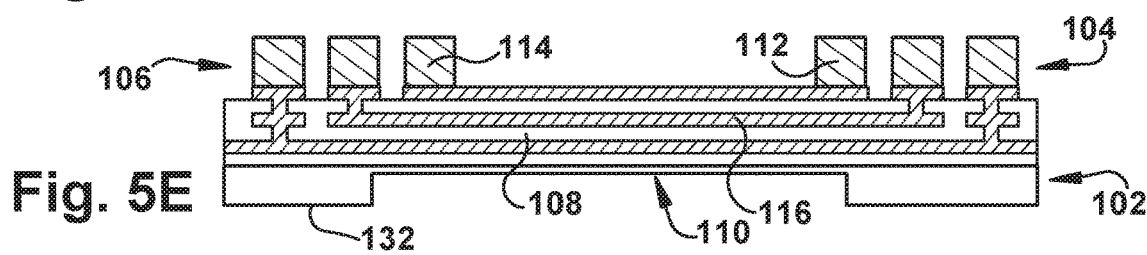

Then, in FIG. 5E, a thickness of one of the chosen and opposing substrate surfaces, depending on the configuration (here, the top opposing substrate surface 132) is selectively reduced, to define a flexible connector bridge 110 longitudinally interposed between the first and second board-facing areas 104 and 106. Optionally, and again depending on the configuration of the flexible connector 100, selectively reducing a thickness of one of the chosen and opposing substrate surfaces to define the flexible connector bridge 110 (e.g., to thickness t2) may include selectively reducing a thickness of the selected one of the chosen and opposing substrate surfaces upon which the first and second board-facing areas 104 and 106 are defined. Alternately, and once again depending on the configuration of the flexible connector 100, selectively reducing a thickness of one of the chosen and opposing substrate surfaces to define the flexible connector bridge 110 (e.g., to thickness t2) may include selectively reducing a thickness of the other one of the chosen and opposing substrate surfaces upon which the first and second board-facing areas 104 and 106 are defined. One of ordinary skill in the art will be able to create a suitable manufacturing process, using standard silicon foundry processes or any other desired processes or techniques, to manufacture a flexible connector 100 having the desired structures and properties for a particular use environment of the present invention.

Figure 5F:
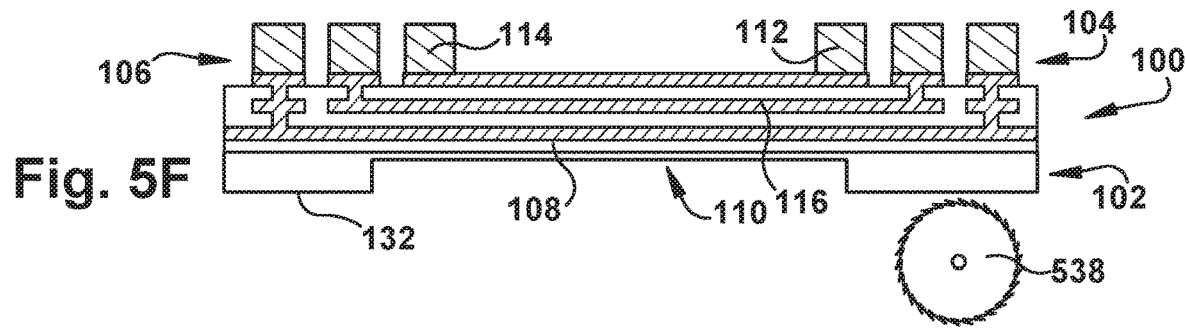
Figure 6:
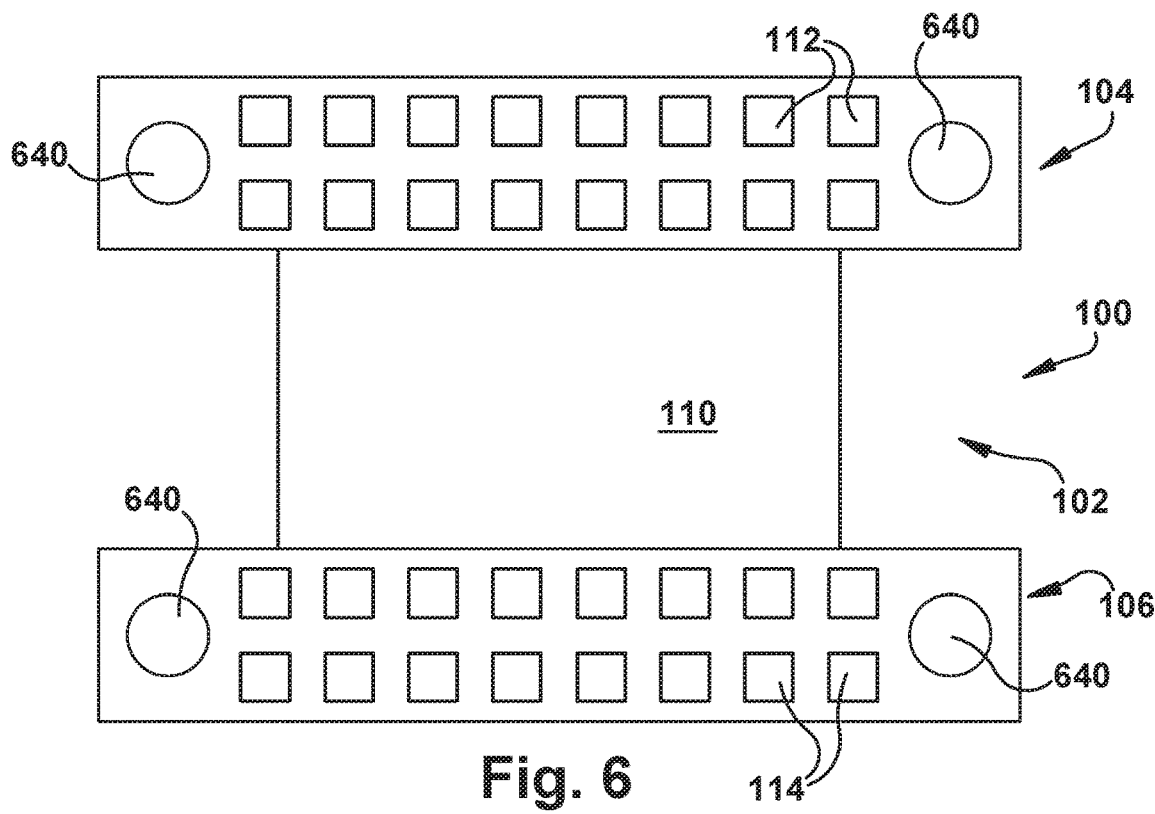
FIG. 6 is a schematic plan view of the aspect of FIG. 1.
Figure 7A:
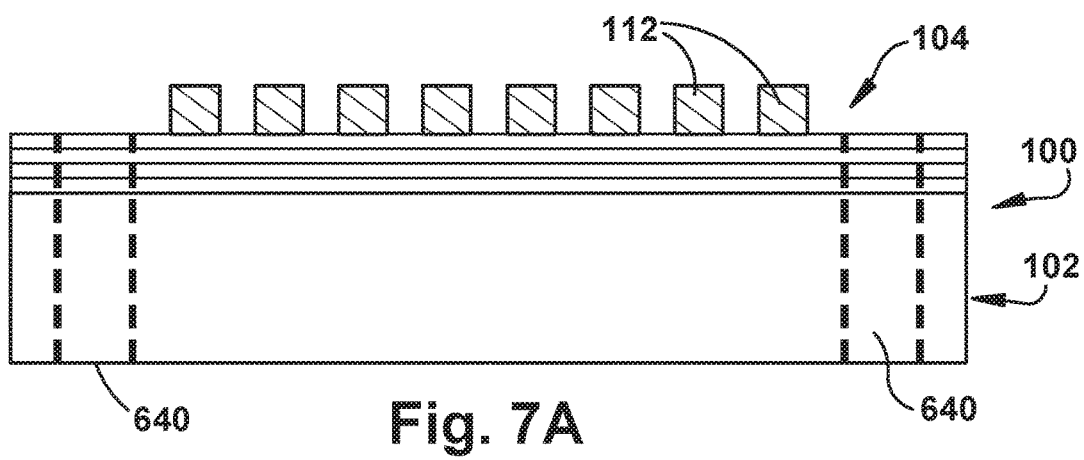
FIGS. 7A-7B are schematic side views of the aspect of FIG. 1 having different example configurations.
Figure 7B:
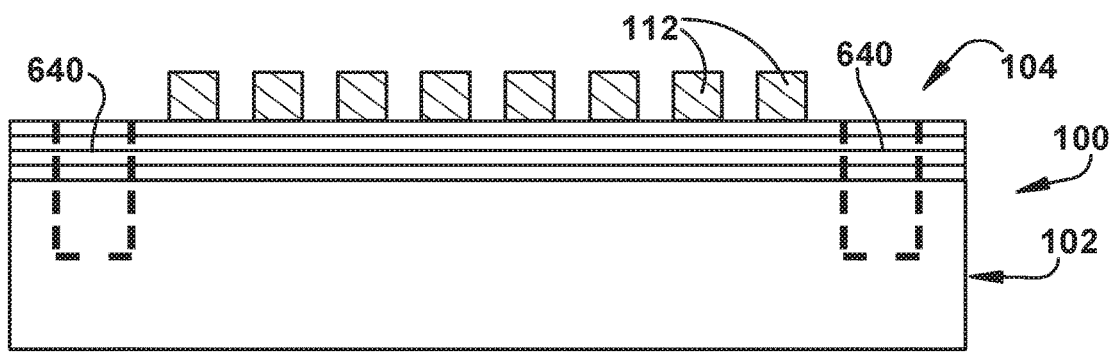

As shown schematically by dicing saw 538 in FIG. 5F, an elongated, mass-produced chain of flexible connector 100 units may be diced or singulated via etching, other chemical techniques, mechanical techniques, or in any other desired manner, into usable-length individual finished flexible connectors 100, by cutting a very long (into and out of the plane of the page in FIGS. 5A-5F) chain into strips. Each of the individual finished flexible connectors 100 may be, for example, in the range of 5-50 millimeters, and, more specifically, in the range of 10-30 millimeters, deep, again, into and out of the plane of the page, in these Figures.

Each of the finished flexible connectors 100 may include facilitation of relative angular motion of the first and second board-facing areas 104 with the connector bridge 110. In this manner, first and second mutually angularly arranged circuit boards 218 and 220 may be electrically connected with a flexible connector 100 including the connector block 102 at least partially formed via the sequence of FIGS. 5A-5F. Namely, the first connector ports 112 on the first board-facing area 104 can be brought into electrical connection with appropriately located pads 222 on the first circuit board 218, and the second connector ports 114 on the second board-facing area 106 can be brought into electrical connection with corresponding pads 222 on the second circuit board 220. Through the connector traces 116 connecting corresponding first and second connector ports 112 and 114, selected pairs of pads 222 on the first and second circuit boards 218 and 222 can therefore be in direct electrical contact while the first and second circuit boards 218 and 220 are mutually arranged at the operative angle α.

Figure 8:
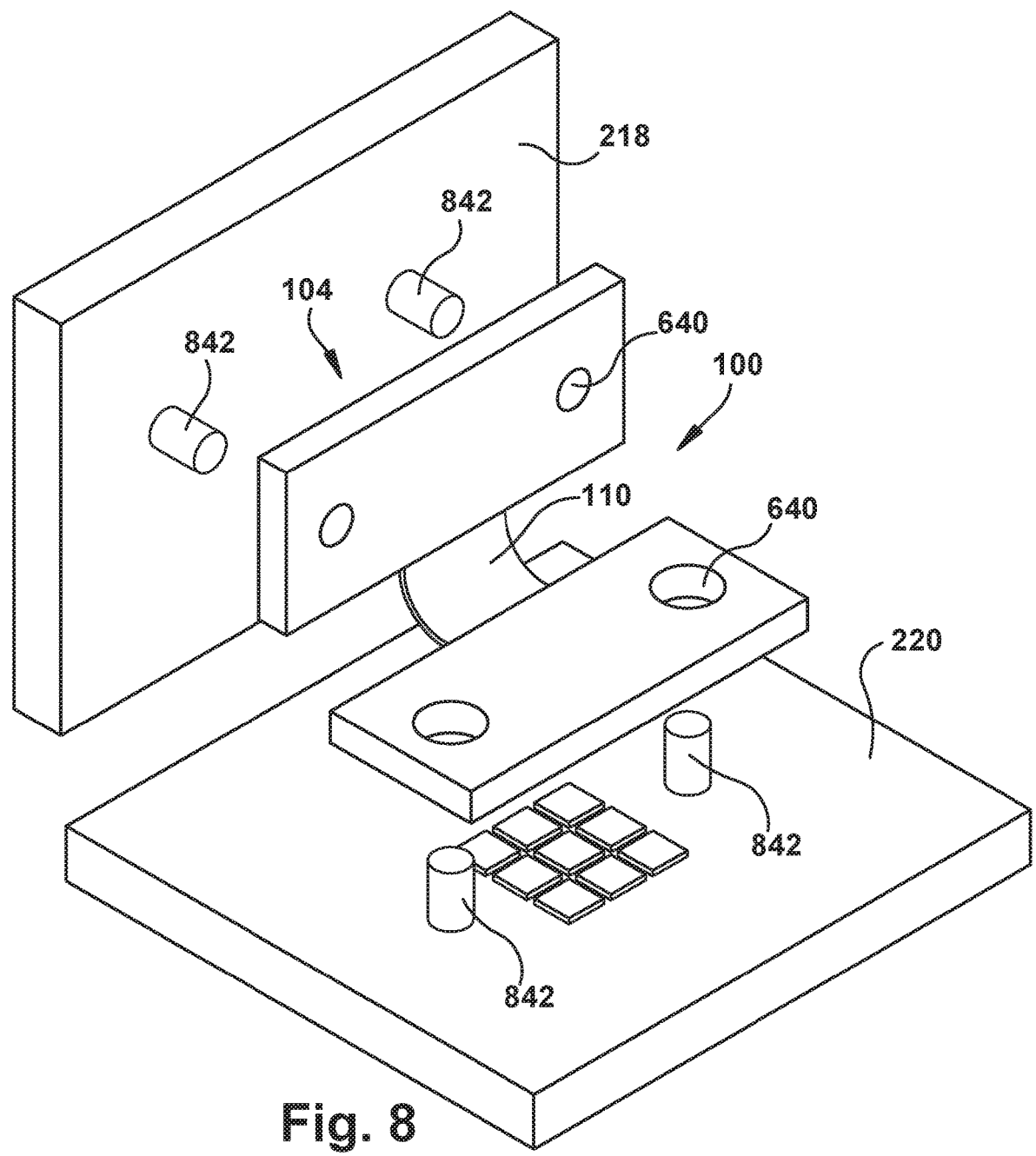
FIG. 8 is a perspective top view of the aspect of FIG. 1 in the example configuration of FIG. 7A.

Turning to FIGS. 6-9C, an orientation scheme for locating a flexible connector 100 as desired in relation to first and second circuit boards 218 and 220, is shown. At least one connector orientation feature 640 is provided to the connector block 102, optionally, as shown, in at least one of the first and second board-facing areas 104 and 106. For example, and as shown in the Figures, the connector orientation features 640 can be full-depth (as shown in FIG. 7A) or blind (as shown in FIG. 7B) holes into/through the block body 108. As shown in FIG. 8, the connector orientation features 640 are configured for selectively engaging corresponding board orientation features 842 on a corresponding first or second circuit board 218 or 220.

The board orientation features 842 are depicted herein as pegs, in part to engage with the aperture type connector orientation features 640 in a male-to-female manner. However, it is contemplated that the board orientation features could be apertures for engaging with peg-type connector orientation features (neither shown) in a female-to-male manner. It is also contemplated that certain of the board orientation features could be apertures, and certain others could be pegs, with corresponding connector orientation features provided, as desired for a particular implementation of the flexible connector 100. While round pegs and apertures are shown for simplicity, it is contemplated that the pegs and apertures, or any other orientation feature structures, could have any suitable shape, configuration, number, placement, and/or mating or engaging features, as desired for a particular use environment. Optionally, one or both of the orientation feature structures could be threaded or otherwise configured to facilitate engagement and maintenance of the flexible connector 100 with the circuit boards 218 and 220.

As shown in FIG. 8, the flexible connector 100 can be therefore guided into engagement, and the engagement optionally at least partially effectuated, through use of the connector and board orientation feature 640 and 842. This sequence of selectively engaging a board orientation feature 842 on a circuit board 218 or 220 with a corresponding connector orientation feature 640 on the flexible connector 100, in the course of electrically connecting first and second mutually angularly arranged circuit boards 218 and 220 with a flexible connector 110 including the connector block 120 is depicted in FIGS. 9A-9C.

Figure 9A:
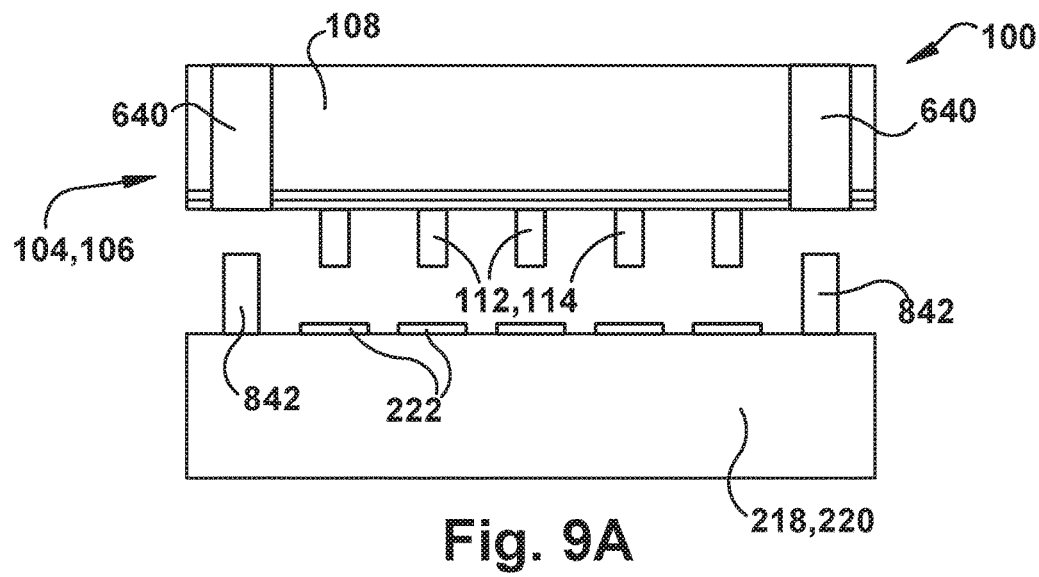
FIGS. 9A-9C schematically depict an example sequence of installation of the aspect of FIG. 1.
Figure 9B:
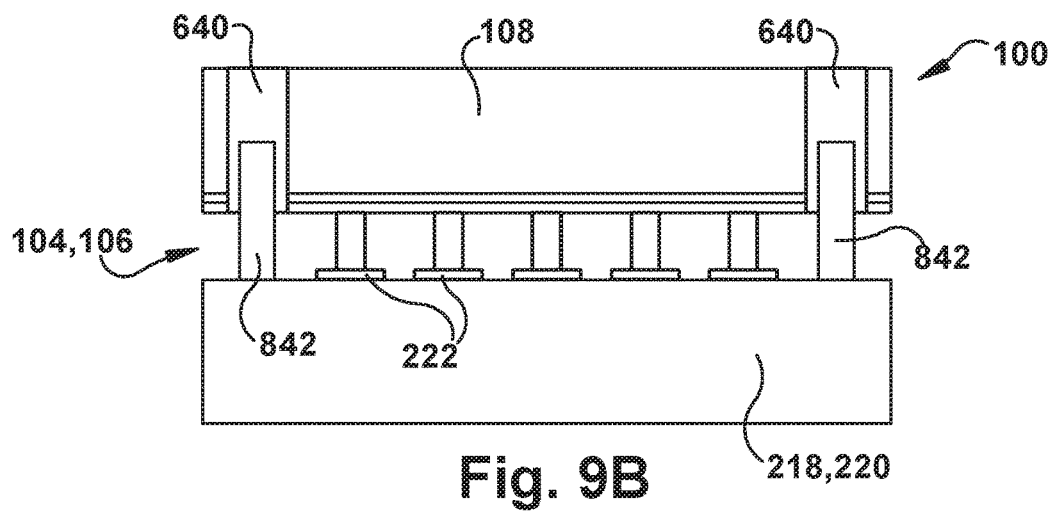
Figure 9C:
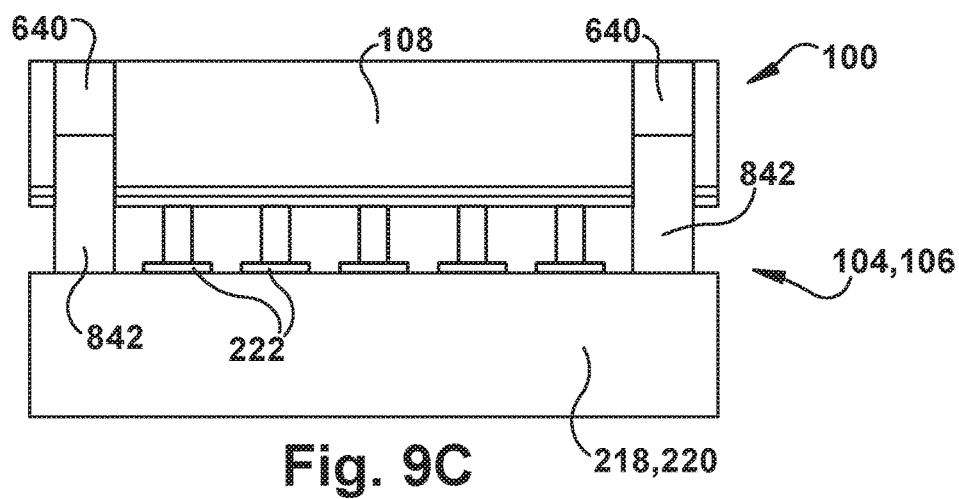

In FIG. 9A, the flexible connector 100 is shown as being aligned as desired with respect to the circuit board 218 or 220 with the connector orientation features 640 poised for engagement with the board orientation features 842. In FIG. 9B, the flexible connector 100 has been lowered toward the circuit board 218 or 222 insert the board orientation features 842 into the connector orientation feature 640. Also as shown in FIG. 9B, the first or second connector ports 112 or 114 have been brought into electrical contact with the pads 222. Finally, in FIG. 9C, one or both of the connector and board orientation features 640 and 842 has been heated to engage and optionally draw down the flexible connector 100 into desired contact with the pads 222 of the first and second circuit boards 218 and 220, particularly if a thermal coefficient of expansion mismatch technique is used.

Regardless of whether or not connector and board orientation feature 640 and 842 are provided to the system, it is contemplated that the flexible connector 100 could be removed from the first and second circuit boards 218 and 220 by simply reversing the above-described sequence of installation.

It is also contemplated that the silicon wafer or other raw material could be completely removed (e.g., to a zero-thickness) at the connector bridge 110 to provide a connector bridge made from a different material than the first and second board-facing areas 104 and 106.

While aspects of this disclosure have been particularly shown and described with reference to the example embodiments above, it will be understood by those of ordinary skill in the art that various additional embodiments may be contemplated. For example, the specific methods described above for using the apparatus are merely illustrative; one of ordinary skill in the art could readily determine any number of tools, sequences of steps, or other means/options for placing the above-described apparatus, or components thereof, into positions substantively similar to those shown and described herein. Any of the described structures and components could be integrally formed as a single unitary or monolithic piece or made up of separate sub-components, with either of these formations involving any suitable stock or bespoke components and/or any suitable material or combinations of materials. Any of the described structures and components could be disposable or reusable as desired for a particular use environment. Any component could be provided with a user-perceptible marking to indicate a material, configuration, at least one dimension, or the like pertaining to that component, the user-perceptible marking aiding a user in selecting one component from an array of similar components for a particular use environment. A "predetermined" status may be determined at any time before the structures being manipulated actually reach that status, the "predetermination" being made as late as immediately before the structure achieves the predetermined status. Certain structures and components are schematically depicted in the Figures as being slightly separated from one another, for clarity of depiction, but one of ordinary skill in the art will understand the contacting relationships between these structures, based at least upon context and the corresponding written description. In an effort to maintain clarity in the Figures, certain ones of duplicative components shown have not been specifically numbered, but one of ordinary skill in the art will realize, based upon the components that were numbered, the element numbers which should be associated with the unnumbered components; no differentiation between similar components is intended or implied solely by the presence or absence of an element number in the Figures. Though certain components described herein are shown as having specific geometric shapes, all structures of this disclosure may have any suitable shapes, sizes, configurations, relative relationships, cross-sectional areas, or any other physical characteristics as desirable for a particular application. Any structures or features described with reference to one embodiment or configuration could be provided, singly or in combination with other structures or features, to any other embodiment or configuration, as it would be impractical to describe each of the embodiments and configurations discussed herein as having all of the options discussed with respect to all of the other embodiments and configurations. A device or method incorporating any of these features should be understood to fall under the scope of this disclosure as determined based upon the claims below and any equivalents thereof.

Other aspects, objects, and advantages can be obtained from a study of the drawings, the disclosure, and the appended claims.

I claim:

1. A method of providing a flexible connector, the method comprising:
providing a planar chosen substrate having transversely spaced top and bottom chosen substrate surfaces;
defining first and second board-facing areas longitudinally spaced from each other on a selected one of the top and bottom chosen substrate surfaces;
providing a planar opposing substrate having transversely spaced top and bottom opposing substrate surfaces;
attaching the chosen and opposing substrates together to at least partially form a unitary connector block including a block body with the first and second board-facing areas on an outward-facing surface thereof;
depositing a conductive material to generate a first connector port located within the first board-facing area;
depositing a conductive material to generate a second connector port located within the second board-facing area;
depositing a conductive material on at least one of the chosen and opposing substrate surfaces to generate a connector trace extending through at least a portion of the block body between the first and second board-facing areas;
electrically connecting the first and second connector ports with the connector trace;
selectively reducing a thickness of one of the chosen and opposing substrate surfaces to define a flexible connector bridge longitudinally interposed between the first and second board-facing areas, the connector bridge and first and second board-facing areas are all made of the same material;
electrically connecting first and second mutually angularly arranged circuit boards with a flexible connector including the connector block, including selectively engaging a board orientation feature on a circuit board with a corresponding connector orientation feature on the flexible connector; and
facilitating relative angular motion of the first and second board-facing areas with the connector bridge.

2. The method of claim 1, wherein selectively reducing a thickness of one of the chosen and opposing substrate surfaces to define the flexible connector bridge longitudinally interposed between the first and second board-facing areas includes selectively reducing a thickness of the selected one of the chosen and opposing substrate surfaces upon which the first and second board-facing areas are defined.

3. The method of claim 1, wherein selectively reducing a thickness of one of the chosen and opposing substrate surfaces to define the flexible connector bridge longitudinally interposed between the first and second board-facing areas includes selectively reducing a thickness of the other one of the chosen and opposing substrate surfaces upon which the first and second board-facing areas are defined.

4. The method of claim 1, wherein depositing a conductive material on at least one of the chosen and opposing substrate surfaces to generate the connector trace includes creating at least one via extending transversely through an increased-thickness portion of the block body.

5. The method of claim 1, wherein the connector trace extends at least partially through a body portion of the connector bridge which is spaced apart from a surface thereof.

* * * * *